(12) United States Patent
Chen et al.

(10) Patent No.: US 9,269,842 B2
(45) Date of Patent: Feb. 23, 2016

(54) WAFER SCALE IMAGE SENSOR PACKAGE AND OPTICAL MECHANISM

(71) Applicant: PixArt Imaging Inc., Hsin-Chu County (TW)

(72) Inventors: Hui-Hsuan Chen, Hsin-Chu County (TW); Tien-Chia Liu, Hsin-Chu County (TW)

(73) Assignee: PIXART IMAGING INC, Hsin-Chu County (TW)

( * ) Notice: Subject to any disclaimer, the term of this patent is extended or adjusted under 35 U.S.C. 154(b) by 0 days.

(21) Appl. No.: 13/675,095

(22) Filed: Nov. 13, 2012

(65) Prior Publication Data

US 2013/0147001 A1    Jun. 13, 2013

(30) Foreign Application Priority Data

Dec. 7, 2011    (TW) .................................. 100144986
Jun. 11, 2012   (TW) .................................. 101120895

(51) Int. Cl.
*H01L 31/02*    (2006.01)
*H01L 31/0232*  (2014.01)
*H01L 31/0216*  (2014.01)

(52) U.S. Cl.
CPC ...... *H01L 31/0232* (2013.01); *H01L 31/02162* (2013.01); *H01L 31/02327* (2013.01)

(58) Field of Classification Search
CPC ................... H01L 31/02327; H01L 31/0232; H01L 31/02162
USPC ............................................... 257/98–99, 432
See application file for complete search history.

(56) References Cited

U.S. PATENT DOCUMENTS

| 6,496,285 | B1 * | 12/2002 | Fujimoto et al. | 358/475 |
| 7,462,871 | B2 * | 12/2008 | Han et al. | 257/81 |
| 2004/0233170 | A1 | 11/2004 | Kang | |
| 2006/0181633 | A1 * | 8/2006 | Seo | 348/340 |
| 2010/0045963 | A1 * | 2/2010 | Yamaguchi et al. | 356/4.01 |
| 2011/0156188 | A1 * | 6/2011 | Tu et al. | 257/432 |
| 2013/0063399 | A1 * | 3/2013 | Noro et al. | 345/175 |

FOREIGN PATENT DOCUMENTS

CN    1538347 A    10/2004

* cited by examiner

*Primary Examiner* — Tran Tran
(74) *Attorney, Agent, or Firm* — Hauptman Ham, LLP

(57) ABSTRACT

There is provided an optical mechanism including a substrate, an image chip, a light source and a securing member. The image chip and the light source are attached to the substrate. The securing member is secured to the substrate and includes a first containing space for accommodating the light source, a second containing space for accommodating the image chip and a blocking region between the first containing space and the second containing space.

14 Claims, 2 Drawing Sheets

WAFER SCALE IMAGE SENSOR PACKAGE AND OPTICAL MECHANISM

CROSS REFERENCE TO RELATED APPLICATION

This application claims the priority benefit of Taiwan Patent Application Serial Number 100144986, filed on Dec. 7, 2011 and Taiwan Patent Application Serial Number 101120894, filed on Jun. 11, 2012, the full disclosure of which are incorporated herein by reference.

BACKGROUND

1. Field of the Disclosure

This disclosure generally relates to an optical mechanism applied to wafer scale packaging and, more particularly, to an optical mechanism using an image sensor whose semiconductor structure is sealed by transparent materials in wafer scale packaging.

2. Description of the Related Art

Presently, the image sensor chip is manufactured by cutting a die from a silicon wafer and then sealing the die with various packaging technologies such as iDip, LGA or COB technology. These packaging technologies are well known to those skilled in the art and thus details thereof are not described herein.

A common feature of the image sensor chips packaged by the above packaging technologies is that the chips are covered by a black cavity and this is a general type of the chip package nowadays. To image sensor chips, this feature can block ambient light outside the package such that an image sensor chip may be directly applied to various applications, e.g. an optical mouse, after being packaged. The image sensor chip may be directly positioned and fixed at a desired height such that it is able to detect reflected light from a table surface to perform optical navigation.

However, with the development of the semiconductor fabrication technology, the wafer scale packaging has become a mature technology. In the wafer scale packaging, it may use transparent materials, e.g. glass or epoxy, to enclose the die to form a package structure; for example, Chip Scale Package (CSP) technology, Through-Silicon Via (TSV) technology and OPLGA technology may perform the packaging process by using transparent glass or epoxy to seal the die. Therefore in the application of an image sensor chip, this kind of chip package does not have a black cavity such that ambient light outside the image sensor chip may pass through the transparent glass or epoxy to influence the operation of the image sensor chip.

According, there is a need to provide a novel optical mechanism and positioning structure capable of being applied to a wafer scale packaging.

SUMMARY

It is an object of the present disclosure to provide an optical mechanism and positioning structure applied to wafer scale packaging and, more particularly, to a wafer scale image sensor package. As transparent materials, such as glass or epoxy, may be used in wafer scale packaging to enclose an outer surface of the semiconductor circuit, the fabricated wafer scale image sensor package does not include a black cavity to block ambient light. Therefore, the present disclosure provides an optical mechanism and positioning structure configured to tightly secure the packaged chip and the optical mechanism and/or positioning structure to a substrate, e.g. a printed circuit mother board (PCB), and block or absorb unnecessary light. To image sensor chips configured to detect light and accordingly generate image signals, it is able to effectively prevent the image sensor chips from being interfered by ambient light to degrade the performance.

The present disclosure provides a wafer scale image sensor package including a die, an intermediate layer and a transparent layer. The die has an active area on a sensing surface of the die. The intermediate layer is disposed on the sensing surface and surrounds the active area. The transparent layer is combined to the die through the intermediate layer, wherein a filter layer and a light blocking layer are formed on at least a partial surface of the transparent layer.

The present disclosure further provides an optical mechanism including a substrate, a wafer scale image sensor package, a light source and a securing member. The wafer scale image sensor package is attached to a front side of the substrate and has an active area. The light source is attached to the front side of the substrate. The securing member is secured to the substrate and includes a first containing space for accommodating the light source, a second containing space for accommodating the wafer scale image sensor package and a blocking region between the first containing space and the second containing space.

The present disclosure further provides an optical mechanism of an optical mouse including a substrate, a wafer scale image sensor package, a light source and a securing member. The wafer scale image sensor package and the light source are attached to the substrate and separated from each other in a lateral distance. The securing member is secured to the substrate and surrounds the wafer scale image sensor package and the light source.

In the optical mechanism of the present disclosure, the securing member further includes a first transparent area and a second transparent area; the first transparent area is configured to allow the light emitted from the light source to emanate from the optical mechanism and reach a reflecting surface; and the second transparent area is configured to allow reflected light from the reflecting surface outside the optical mechanism to pass through and reach the active area, wherein the first transparent area and the second transparent area are lens structures.

In the optical mechanism of the present disclosure, the wafer scale image sensor package has a sensing surface and a backside opposite to each other, wherein the wafer scale image sensor package is mounted to a front side of the substrate via the backside thereof; and a circuit layout is formed on the front side of the substrate to connect to the wafer scale image sensor package.

In the wafer scale image sensor package of the present disclosure, a filter layer of wavelength of interest is coated on at least a partial surface of the transparent layer and/or the sensing surface of the die to allow light of the wavelength of interest to pass through; for example, an infrared and blue filter (B+IR pass filter) allows blue light and infrared light to pass through and an IR pass filter allows infrared light to pass through.

In the wafer scale image sensor package of the present disclosure, at least one reflecting layer, which contains metal components, is coated on at least a partial surface of the transparent layer and/or the sensing surface of the die such that radiation of specific wavelengths may be reflected by the reflecting layer and not enter the image sensor chip.

In the optical mechanism of the present disclosure, a securing member is provided to secure to the substrate, and the image sensor chip is directed mounted to the substrate after a light blocking layer and a filter layer of wavelength of interest are coated on the image sensor chip.

In the optical mechanism of the present disclosure, the wafer scale image sensor package may be directly bonded to the substrate and then the securing member is covered on the wafer scale image sensor package and secured to the substrate such that the securing member and the image sensor chip may keep a stable relative position.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be mentioned that in the embodiments and drawings mentioned herein, components irrelevant to the present invention are omitted and the proportional relationship between every component is for illustration purpose but not to limit the actual proportion thereof.

Figure 1:
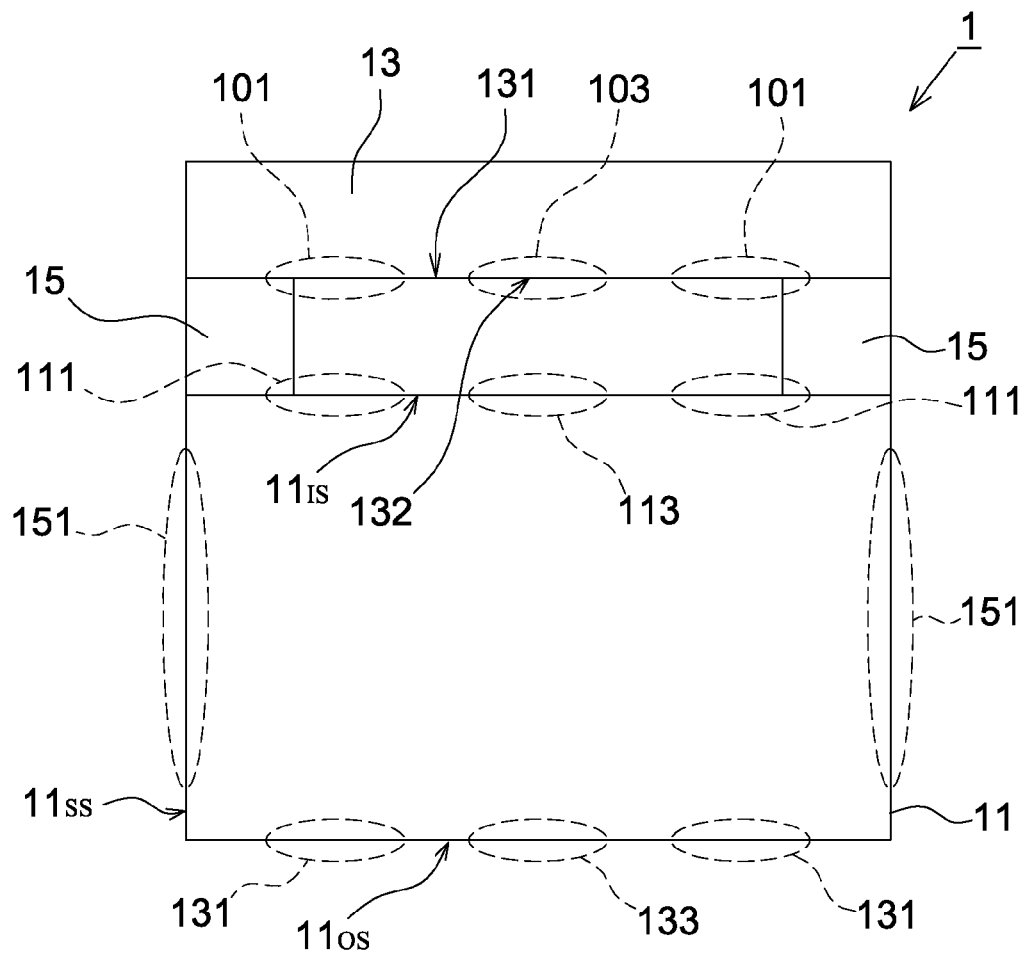
FIG. 1 shows a schematic diagram of the wafer scale image sensor package according to an embodiment of the present disclosure.

FIG. 1 shows a schematic diagram of the wafer scale image sensor package according to an embodiment of the present disclosure. The wafer scale image sensor package 1 includes a transparent layer 11, a die 13 and an intermediate layer 15, wherein the transparent layer 11 may be a glass layer or an epoxy layer, and the intermediate layer 15 is disposed between the die 13 and the transparent layer 11 to function as a buffer and combination between the transparent layer 11 and the die 13. The die 13 may be a light sensing element which is a semiconductor circuit formed on a silicon wafer. The die 13 has an active area 132 on a sensing surface 131 thereof, wherein the active area 132 may be located substantially at a center area of the sensing surface 131, but not limited thereto. The intermediate layer 15 is disposed on the sensing surface 131 and surrounds the active area 132, and preferably the intermediate layer 15 does not block the active area 132. The transparent layer 11 has an inner surface $11_{IS}$ facing the die 13, an exterior surface $11_{OS}$ opposite to the inner surface $11_{IS}$ and a lateral surface $11_{SS}$. In this embodiment, a filter layer and a light blocking layer are formed on at least a partial surface of the transparent layer 11 and/or the sensing surface 131 of the die 13, wherein the light blocking layer may be a reflecting layer or an absorption layer (described later).

In this embodiment, the reflecting layer may be coated on at least one of the locations 101, 111, 131 and 151. The filter layer of wavelength of interest may be coated on at least one of the locations 103, 113 and 133. That is, the filter layer may be formed on at least a partial surface of at least one of the inner surface $11_{IS}$, the exterior surface $11_{OS}$ and the sensing surface 131 of the die 13, wherein the filter layer is preferably opposite to the active area 132 of the die 13; and the reflecting layer may be formed on at least a partial surface of at least one of the inner surface $11_{IS}$, the exterior surface $11_{OS}$, the lateral surface $11_{SS}$ and the sensing surface 131 of the die 13. As the reflecting layer may contain metal components such as Chromium or others, it is able to effectively limit the light to enter the transparent layer 11 or the die 13 through the area without being coated with the reflecting layer. The filter layer of wavelength of interest and the reflecting layer may be partially overlapped and will not interfere with each other. In this embodiment, the locations 103, 113 and 133 are effective fields of view of the light sensing element and the effective fields of view are preferably opposite to the active area 132.

If the reflecting layer has to be formed at a higher temperature, materials of the transparent layer 11 may select those that can tolerate a high temperature, such as the glass material, and the epoxy material is not suitable in this case.

The filter layer of wavelength of interest is configured to allow light of the wavelength of interest to pass through, such as an infrared and blue filter (B+IR pass filter) may allow blue light and infrared light to pass through, and an IR pass filter may allow infrared light to pass through. According to different designs of the chip 1, different filter layers may be used. For example, in an optical mouse using a light source emitting blue light, the B+IR pass filter may be used; and in an optical mouse using a light source emitting invisible light, the IR pass filter may be used.

For the filter layer having soft material, it is not suitable to be coated on the outer surface of the wafer scale image sensor package 1; that is, it is not suitable to be coated at the location 133 in order to prevent the filter layer from being damaged or scratched. In this case, the filter layer is preferably formed on the inner surface $11_{IS}$ of the transparent layer 11 or directed coated on the sensing surface 131 of the die 13.

The aforementioned filter layer and the reflecting layer may be simultaneously coated on different locations according to different designs of the optical mechanism and the light sensing element such that the reflecting and the absorbing effects may satisfy the design requirement, e.g. coating the filter layer on both locations 103 and 113.

In another embodiment, if the light to be received is visible light, an IR pass filter may be used to absorb or block the visible light. In this embodiment, the IR pass filter may be coated on the locations coated with the reflecting layer described in the previous embodiment; i.e. at least one of the locations 101, 111, 131 and 151, to be served as an absorption layer. In other words, a reflecting layer or an absorption layer may be formed on at least one of the locations 101, 111, 131 and 151 to be served as a light blocking layer. As the IR pass filter can absorb visible light, areas without being coated with the IR pass filter may allow visible light to pass through so as to achieve the object of limiting the penetration of the visible light. In other words, whether a reflecting layer or an absorption layer is formed on the transparent layer 11 and the sensing surface 131 of the die 13 is determined according to the operation property of the light sensing element.

Figure 2:
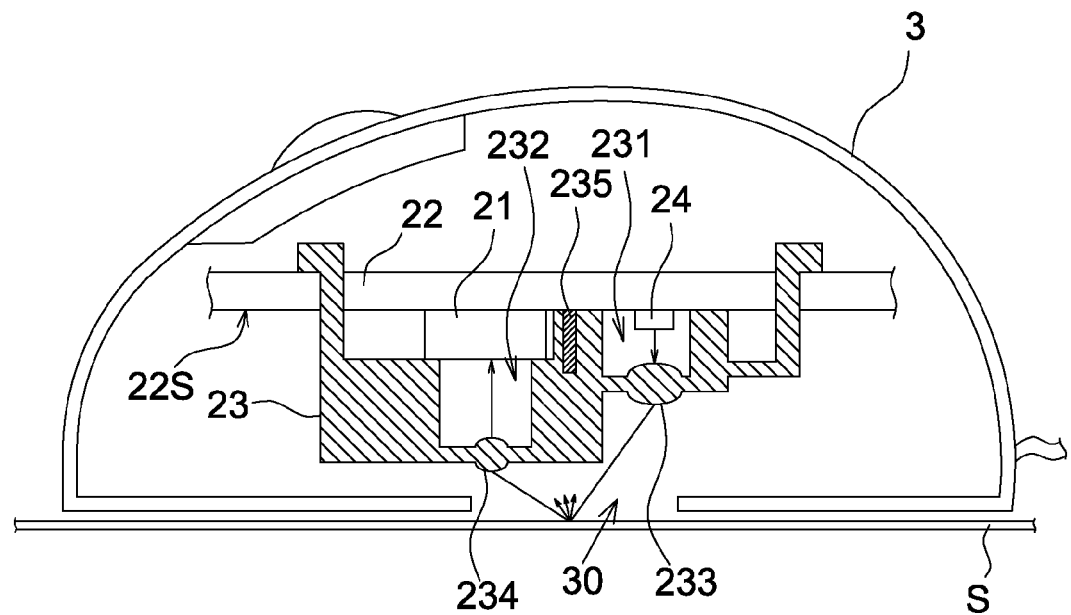
FIG. 2 shows a schematic diagram of an optical mechanism and an optical mouse including the optical mechanism according to an embodiment of the present disclosure.

FIG. 2 shows a schematic diagram of the optical mechanism according to an embodiment of the present disclosure, wherein the wafer scale image sensor package 21 (may be referred to a chip 21 hereinafter) is an image sensor chip packaged by wafer scale packaging as shown in FIG. 1. That is, the chip 21 includes a die 13 and a transparent layer 11 combined together through an intermediate layer 15; and a reflecting layer and a light blocking layer may be formed on at least a partial surface of the transparent layer 11 and/or the sensing surface 131 of the die 13 (referring to FIG. 1 and corresponding descriptions). FIG. 2 shows a schematic diagram of the optical mechanism applied to an optical mouse and thus a light source 24 is further included therein. The light source 24 emits light to pass through the securing member 23 to reach a reflecting surface S, and reflected light from the reflecting surface S passes through the securing member 23 again to reach the chip 21.

More specifically, the optical mechanism of the present disclosure includes a substrate 22, a wafer scale image sensor package 21, a securing member 23 and a light source 24. The chip 21 is attached to a front side 22S of the substrate 22 and has an active area 132 (as shown in FIG. 1). The light source 24 is attached to the front side 22S of the substrate 22 and emits light going outward from the front side 22S. The securing member 23 is secured to the substrate 22, wherein the securing member 23 preferably surrounds the chip 21 and the light source 24 for keeping out dust. The securing member 23 has a first containing space 231 for accommodating the light source 24, a second containing space 232 for accommodating the chip 21 and a blocking region 235 between the first containing space 231 and the second containing space 232. The securing member 23 further has a first transparent area 233 associated with the light source 24 and a second transparent area 234 associated with the chip 21, preferably associated with the active area 132 of the chip 21. The first transparent area 233 allows the light emitted from the light source 24 to emanate from the optical mechanism and to reach the reflecting surface S. The second transparent area 234 allows reflected light reflected from the reflecting surface S outside the optical mechanism to pass through and to reach the active area 132 of the chip 21.

The optical mechanism of the present disclosure is generally disposed inside a housing 3, such as a mouse shell, and the housing 3 may be disposed on a reflecting surface S for being operated by a user and the housing 3 has a bottom hole 30. The light emitted from the light source 24 illuminates the reflecting surface S through the first transparent area 233 and the bottom hole 30. The reflected light (including stray light) from the reflecting surface S passes through the bottom hole 30 again and then reaches the active area 132 of the chip 21 through the second transparent area 234.

A shape of the securing member 23 may be designed corresponding to the chip 21 and the light source 24 without any limitation as long as the function of keeping out dust can be achieved.

In the present disclosure, the securing member 23 may be fastened to the substrate 22 using a cantilever structure and thus at least one hollow may be previously formed on the substrate 22 to allow the cantilever to go through and engage the substrate 22, and a size of the hollow is formed in a way so that the cantilever can go through and the hollow may not tightly embrace the cantilever.

It is clear from FIG. 2 that light guiding structures may be formed in front of the chip 21 (i.e. the second transparent area 234) and the light source 24 (i.e. the first transparent area 233) on the securing member 23. In this embodiment, the light guiding structure associated with the light source 24 is configured to allow the light emitted from the light source 24 to be directed to the reflecting surface S and the light guiding structure associated with the chip 21 is configured to converge the reflected light from the reflecting surface S. That is, the first transparent area 233 and the second transparent area 234 may be lens structures. It is appreciated that a propagation direction of light in FIG. 2 is only exemplary.

The chip 21 may be bonded to the substrate 22 through solder balls or bonding pads.

In the present disclosure, the blocking region 235 inside the securing member 23 between the light source 24 and the chip 21 may be a hollow region, a hollow region with a rough surface or filled with other stuffs such that light emitted from the light source 24 can not impinge on the chip 21 laterally, wherein the stuff may be any suitable opaque material.

The present disclosure also discloses that the light guiding structure associated with the light source 24 (i.e. the first transparent area 233) and the light guiding structure associated with the chip 21 (i.e. the second transparent area 234) may not locate at the same plane and may be adjusted according to requirements. Certainly, the first transparent area 233 and the second transparent area 234 may locate at the same plane.

Figure 3:
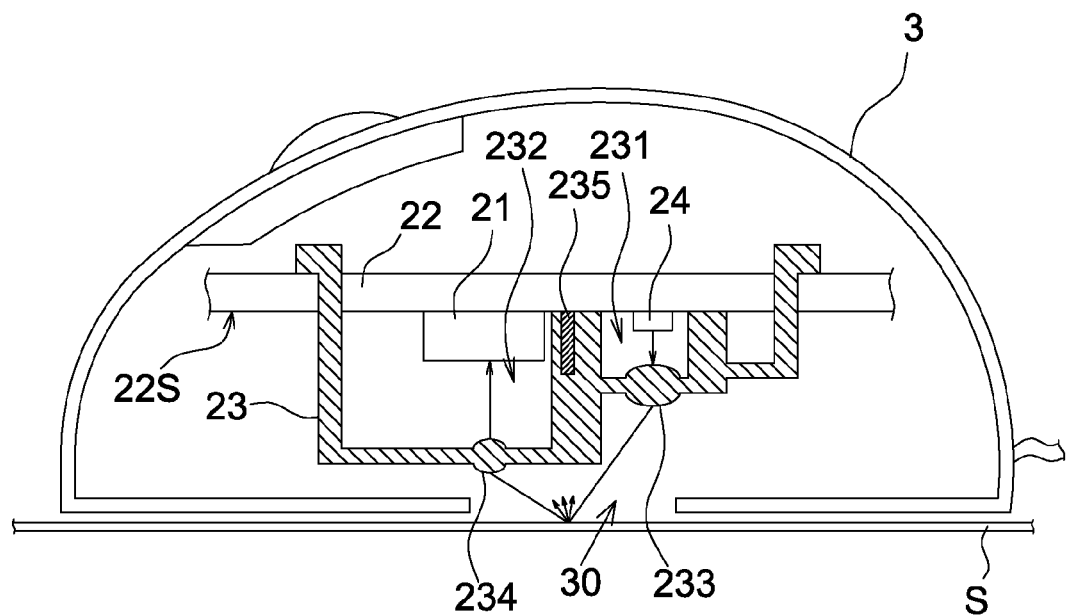
FIG. 3 shows a schematic diagram of an optical mechanism and an optical mouse including the optical mechanism according to another embodiment of the present disclosure.

Please refer to FIG. 3, it shows a schematic diagram of the optical mechanism according to another embodiment of the present disclosure. The difference between FIG. 3 and FIG. 2 is that the securing member 23 in this embodiment is not in contact with the chip 21 as a light blocking layer and a filter layer are coated on the chip (referring to FIG. 1 and corresponding descriptions). Therefore in this embodiment, the securing member 23 only needs to keep a relative position with respect to the chip 21. In other words, in the present disclosure the securing member 23 may or may not be in contact with the chip 21.

The substrate 22 mentioned above may be an inflexible substrate such as a PCB substrate and is configured to combine and fix the securing member 23. Meanwhile, a front side 22S of the substrate 22 may have a circuit layout to electrically connect to the chip 21. In addition, the securing member 23 may be fastened to the substrate 22 in other ways, such as a screw may be used to fix the securing member 23 on the substrate 22 so as to keep stable relative positions between every element, but not limited thereto.

As mentioned above, the optical mechanism of the present disclosure may keep the wafer scale image sensor package at a predetermined position and block or absorb ambient light outside the image sensing element so that the image sensing system can operate correctly in the image sensor application.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An optical mechanism, comprising:
   a substrate having a front side and a rear side opposite to the front side;
   a wafer scale image sensor package attached to the front side of the substrate and having an active area;
   a light source attached to the front side of the substrate; and
   a securing member secured to the substrate from a front of the active area of the wafer scale image sensor package and comprising
   a first portion engaging the rear side of the substrate,
   a second portion extending from the first portion through a hollow in the substrate to the front side of the substrate,
   a third portion connected to the second portion to form
   a first containing space for accommodating the light source, and
   a second containing space for accommodating the wafer scale image sensor package, and
   a blocking region being a part of the securing member extending toward the front side of the substrate and separating the first containing space from the second containing space.

2. The optical mechanism as claimed in claim 1, wherein the optical mechanism is applied to an optical mouse.

3. The optical mechanism as claimed in claim 1, wherein the securing member further comprises a first transparent area associated with the light source and a second transparent area associated with the active area of the wafer scale image sensor package.

4. The optical mechanism as claimed in claim 3, wherein the first transparent area and the second transparent area are lens structures.

5. The optical mechanism as claimed in claim 1, wherein the wafer scale image sensor package comprises a die and a transparent layer combined together through an intermediate layer; the active area of the wafer scale image sensor package is on a sensing surface on the die; and a filter layer and a light blocking layer are formed on at least a partial surface of the transparent layer.

6. The optical mechanism as claimed in claim 5, wherein the transparent layer has an inner surface facing the die, an exterior surface opposite to the inner surface and a lateral surface; the filter layer is formed on at least one of the inner surface and the exterior surface; and the light blocking layer is formed on at least one of the inner surface, the exterior surface and the lateral surface.

7. The optical mechanism as claimed in claim 5, wherein the filter layer and the light blocking layer are further formed on the sensing surface of the die.

8. The optical mechanism as claimed in claim 5, wherein the filter layer is an IR pass filter or an infrared and blue filter.

9. The optical mechanism as claimed in claim 1, wherein the blocking region comprises a hollow region or a region filled with opaque material.

10. The optical mechanism as claimed in claim 1, wherein the securing member is or is not in contact with the wafer scale image sensor package.

11. An optical mechanism of an optical mouse, comprising:
   a substrate having a front side and a rear side opposite to the front side;
   a wafer scale image sensor package attached to the front side of the substrate and having an active area on a sensing surface thereof;
   a light source attached to the front side of the substrate; and
   a securing member secured to the substrate from a front of the active area of the wafer scale image sensor package and surrounding the wafer scale image sensor package and the light source, wherein the securing member has
      a first portion engaging the rear side of the substrate,
      a second portion extending from the first portion through a hollow in the substrate to the front side of the substrate, and
      a third portion connected to the second portion and directly pressing against a part of the sensing surface of the wafer scale image sensor package.

12. The optical mechanism as claimed in claim 11, wherein the wafer scale image sensor package comprises a die and a transparent layer combined together through an intermediate layer, and a filter layer and a light blocking layer are coated on at least a partial surface of at least one of the transparent layer and the die.

13. The optical mechanism as claimed in claim 12, wherein
   the transparent layer has an inner surface facing the die, an exterior surface opposite to the inner surface and a lateral surface;
   the filter layer is coated on at least one of the inner surface, the exterior surface and the die; and
   the light blocking layer is coated on at least one of the inner surface, the exterior surface, the lateral surface and the die.

14. The optical mechanism as claimed in claim 11, wherein the securing member further comprises a lens structure associated with the wafer scale image sensor package and a lens structure associated with the light source.

* * * * *